United States Patent [19]
Owski et al.

[11] Patent Number: 5,121,066
[45] Date of Patent: Jun. 9, 1992

[54] VARIABLE LOAD DUMP SIMULATOR SYSTEM

[75] Inventors: Alexander J. Owski, Redford; James P. Muccioli, Farmington Hills; Terry M. North, Harper Woods; Richard W. Warner, Southfield, all of Mich.

[73] Assignee: Chrysler Corporation, Highland Park, Mich.

[21] Appl. No.: 632,299

[22] Filed: Dec. 3, 1990

[51] Int. Cl.⁵ ...................... G01R 27/00; G01R 31/02
[52] U.S. Cl. .................................. 324/618; 324/603; 324/546; 307/108
[58] Field of Search ............... 324/618, 603, 545, 546; 307/108

[56] References Cited
U.S. PATENT DOCUMENTS

| | | | |
|---|---|---|---|
| 2,990,514 | 6/1961 | Johnson | 324/618 X |
| 3,742,346 | 6/1973 | Specht | 324/547 |
| 4,079,265 | 3/1978 | Woodburn | 307/108 |
| 4,401,942 | 8/1983 | Renz | 324/679 |
| 4,409,542 | 10/1983 | Becker et al. | 324/548 |

Primary Examiner—Kenneth A. Wieder
Assistant Examiner—Glenn W. Brown
Attorney, Agent, or Firm—Wendell K. Fredericks

[57] ABSTRACT

A variable transient simulator employs a source of pulsating DC voltage for charging a first capacitance bank to a desired potential difference. After a device under test (DUT) is connected to a second capacitance bank, the charged-up first capacitance band is isolated from the DC voltage source and allowed to discharge into the second capacitance bank and, together, both capacitance banks provide discharging current into the DUT which simulates a desired loop during transient response. The simulator can provide repetitive as well as variable positive and negative transients.

4 Claims, 8 Drawing Sheets (Intermittent Faults)

(Prior Transient Simulator Waveforms)

VARIABLE LOAD DUMP SIMULATOR SYSTEM

1. FIELD OF INVENTION

This invention relates to transient simulation and more particularly to simulating high energy, worse case load dump transients as well as intermediate transients caused by, e.g., a sudden removal of a load lead while heavily loading an automobile alternator.

2. BACKGROUND OF THE INVENTION

Various available simulators provide transients for determining endurance of automobile electronic devices such as radios, engine controllers, information displays, etc. One simulator generates a very fast rise time 80 volt, 22 amp pulse which decays to 0 volt in approximately 300 ms. This simulator has a bank of capacitors having a capacity of about 29K $\mu F$ and an output impedance of about 4 ohms which discharges into a device-under-test (DUT) upon turning on a silicon controlled rectifier (SCR).

Recognizing that in the real world with modern alternators, the removal of a battery lead or when battery terminals become corroded while heavily loading an automobile alternator will generate a transient. The transient would build up in 5 to 10 ms, and rise from an alternator voltage of 13.5 volts to a high voltage level of about 105 volts With a peak current of 150–200 amperes; then decay back to the battery voltage in about 300 ms depending upon the time it takes the voltage regulator to reduce the alternator field.

As the transient rises to the 30 volt level, destruction of the vehicle lights occur; at about 60 to 80 volts, destruction of the engine control electronics and the radio occur. At other voltage levels of the transient, destruction of various other electronic devices results. Also, in the real world, intermittent worse case load dump transients sometimes appear.

Another severe transient, alternator field decay transient, produces negative pulses which occur after disconnection of the field from the battery when turning the ignition switch off. The amplitude of this transient depends upon the voltage regulator cycle at the time of shutdown and may vary from $-40$ to $-100$ volts with a duration of 200 ms.

Hence, to realistically simulate worse case transients and to develop the capability of protecting automotive devices from destruction during the various stages of the transient, a particular type of simulator which accurately reproduces the worst case alternator load dump and intermediate resistive and inductive disruption was needed. A search instituted to find such a simulator resulted in the simulator of the present invention.

SUMMARY OF THE INVENTION

The present invention concerns apparatus and methods used for analyzing susceptibility of test items to worst case load dump and intermediate resistive and inductive disruptive transients under bench test conditions. A source of pulsating DC voltage charges up a first bank of capacitors to the potential of the charging voltage. Then the charged capacitors of the first bank are isolated from the voltage source and allowed to discharge into a second bank of capacitors to generate a transient pulse which simulates the worst case load dump transient pulse. The test item which connects to the simulator system and which operates on its own power is subjected to this generated transient to determine whether the test items include suitable transient suppression devices to survive the generated pulse.

The system also includes circuits for generating repetition of generated load dump transients, variable amplitude positive and negative transients.

DETAILED DESCRIPTION OF A PREFERRED EMBODIMENT A VEHICLE ALTERNATOR SYSTEM

Figure 1:
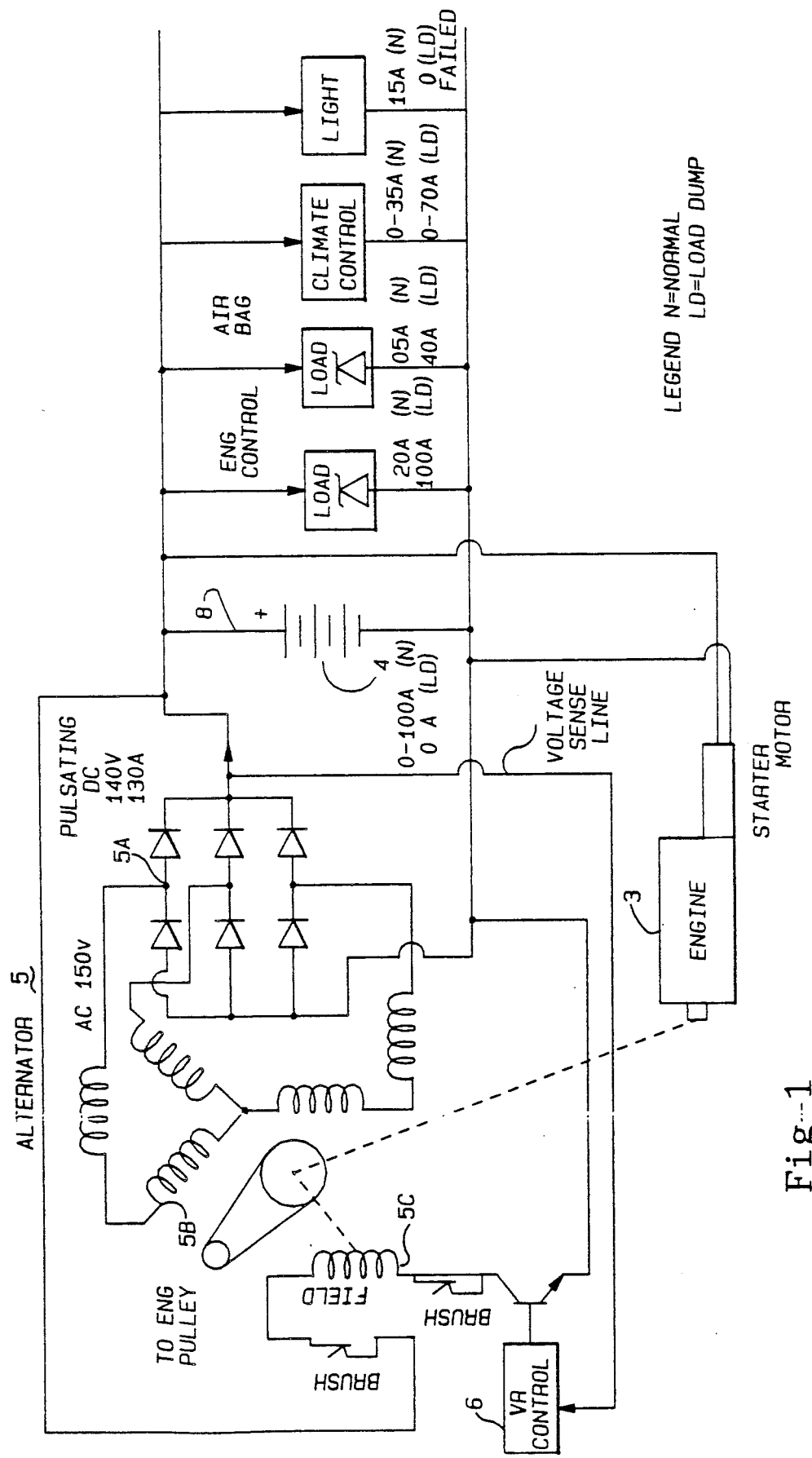
FIG. 1 depicts a typical vehicle alternator system which, under certain conditions, could generate worst case load dump transients and various other positive and/or negative transients.

FIG. 1 depicts a typical vehicle alternator system having a 12 volt, lead-acid, wet storage battery as the primary power storage device and having the primary job of cranking the engine. The battery stores energy to supply the electrical system power, including the cranking system during start-up of an engine 3.

Alternator 5 supplies the vehicle electrical loads as well as the battery charging current during vehicle operation. The alternator has built-in rectifiers 5A to convert the normal three phase AC output to DC. The alternator has a wound rotor or field 5C to permit affecting output voltage control by the controlling input current applied to field 5C. Alternator 5 current output capacity could range from 37 amps up to 150 amps at voltage levels to about 200 volts.

Also removal of load leads of other components such as a 5 ampere line going to an air bag circuit or a 30 ampere line going to an engine control or other micro processor-controlled systems will generate a load dump transient of a lesser magnitude than the removal of the battery lead under worst case conditions.

The voltage regulator control circuit 6 completes the alternator system. Circuit 6 controls the output to a specific value by controlling the rotor field. Circuit 6 also prevents over-charging of the battery by reducing system voltage as battery back EMF decreases at higher temperatures.

LOAD DUMP TRANSIENTS

Abrupt reductions of the alternator loads can cause load dump transients. A sudden disconnection of a battery or load cable 8 will initiate a transient.

The worse case occurs when a discharged battery 4 is disconnected from alternator 5 which is charging at the rated load. The discharged battery 8 creates the greatest single load on the alternator. To abruptly remove it causes the greatest possible load change.

Such transients can and do occur in the real world. Devices containing sufficient transient suppression means can encounter and survive these transients.

Figure 2:
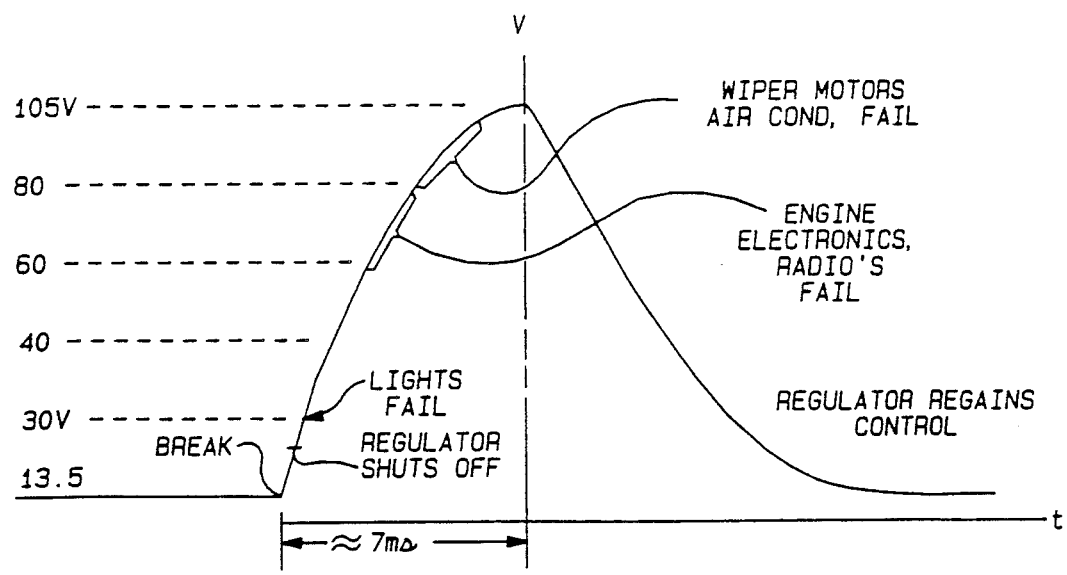
FIG. 2 illustrates a worst case load dump transient waveform.

FIG. 2 depicts a worse case transients caused by the abrupt removal of a battery cable. Note that when the transient reaches about 30 volts, the lights in the vehicle fail. Somewhere between 60 and 80 volts, the engine electronics and the radio fail. Around 80 to 150 volts, the wiper motors and air conditioner fail.

Figure 3:
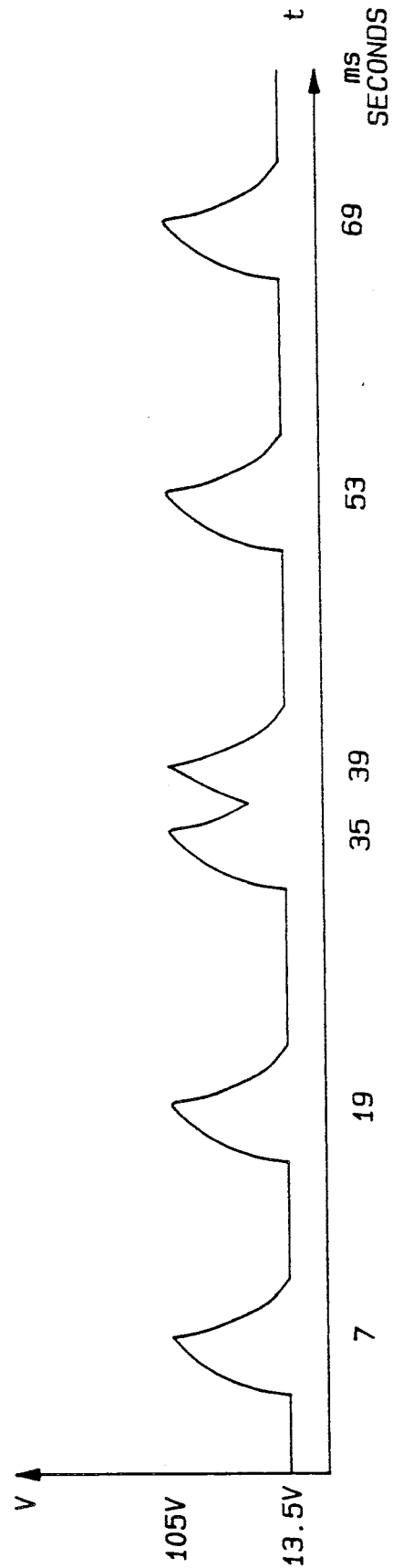
FIG. 3 shows a typical intermittent load dump transient waveform.

FIG. 3 depicts worse case intermittent transient spikes caused by battery cable bouncing up and down on the battery terminal. Note that transient spikes of 105 volts can occur repeatedly and adjacently. Hence, great damage can occur to devices receiving such transient spikes.

A PRIOR TRANSIENT SIMULATOR

Figure 4:
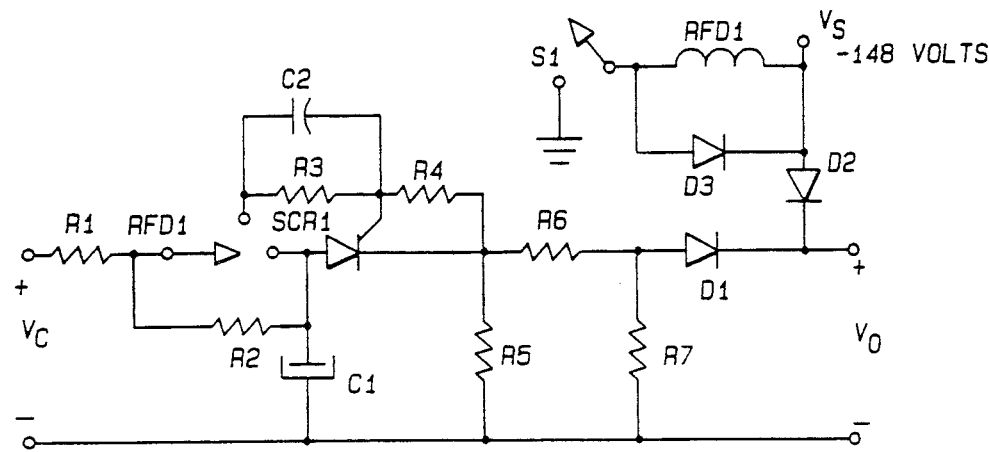
FIG. 4 shows a prior art load dump transient simulator.

FIG. 4 depicts a version of a prior transient simulator which charges the storing capacitor up to a voltage of about 80 V. This version of a simulator is based on one described at page 7 in a Society of Automotive Engineers, Inc. publication—SAE J1113a entitled "Electromagnetic Susceptibility Procedures For Vehicle Components".

To transfer the charge to a device under test, a fast switching device such as an SCR is used. Hence, the rise time of the applied transient follows a very fast turn ON time of the SCR. The simulated field decay time is controlled by the time constant of capacitor C1 and resistor R5. This simulator presents an impedance of about 4 ohms to the device under test which limits its peak current to about 22 amperes.

The rise time and impedance parameters of this simulator do not permit a realistic simulation of a worst case load dump transient pulse of present-day vehicles.

Figures 5A, 5B:
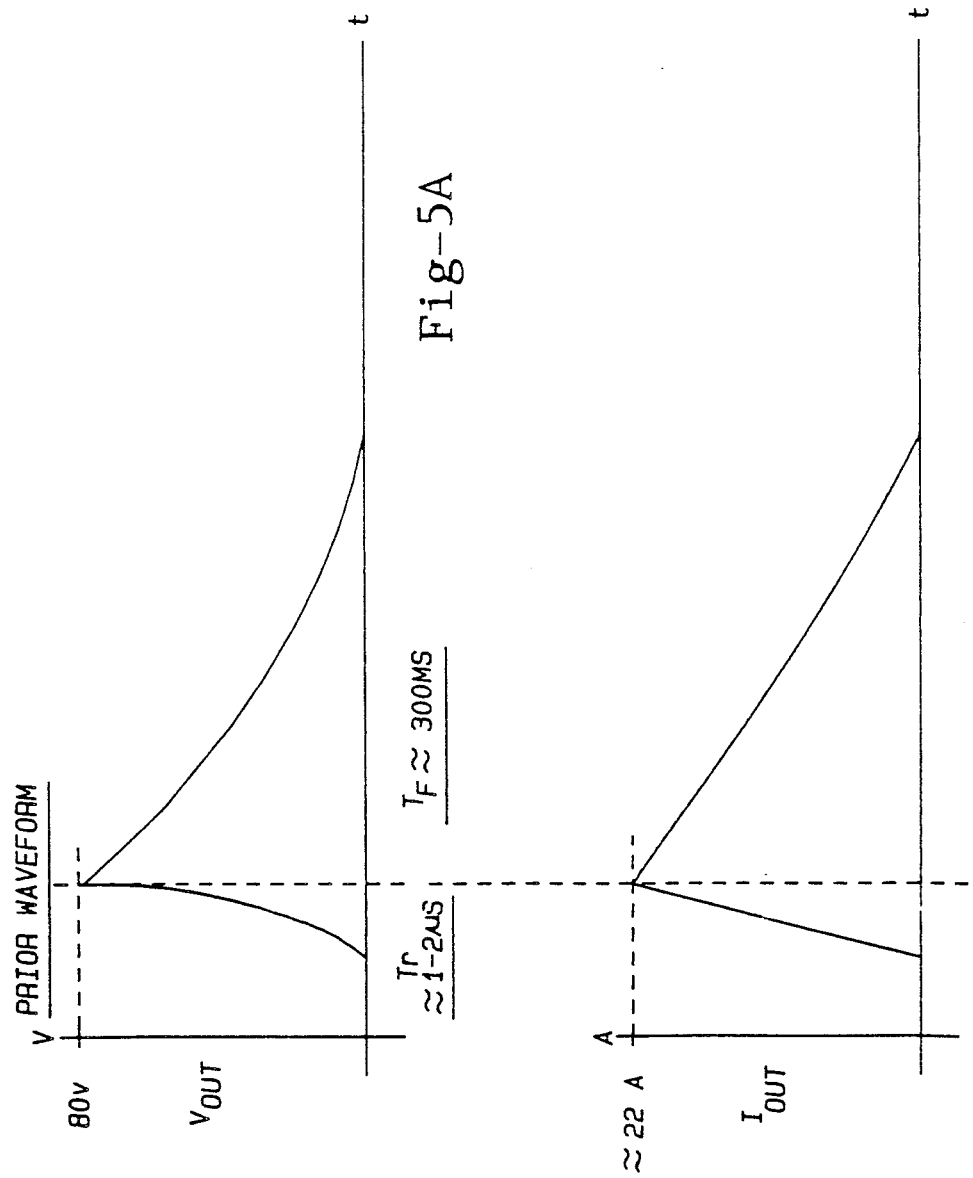
FIGS. 5A and 5B illustrates the voltage and current transient waveforms generated by the prior art transient simulator of FIG. 4.

FIGS. 5A and 5B illustrate the voltage and current transient waveforms, respectively, generated by the prior transient simulator. Note that the voltage rise time is approximately 1 to 2 $\mu$s and has a dampened negative excursion fall time of approximately 300 ms. The current reaches about 22 amps. Hence, this simulator can provide approximately 15 joules of energy to a device under test with a load impedance of approximately one-half ohm.

Comparing FIG. 5 with FIG. 2, shows that this prior transient simulator does not accurately simulate the load dump transients of the vehicle. Even if, for example, the engine control electronics could survive this transient from this simulator, the device would fail in the car because this voltage and current does not represent the transient current in present day alternator charging systems.

A PREFERRED EMBODIMENT OF A LOAD DUMP SIMULATOR

Figure 6:
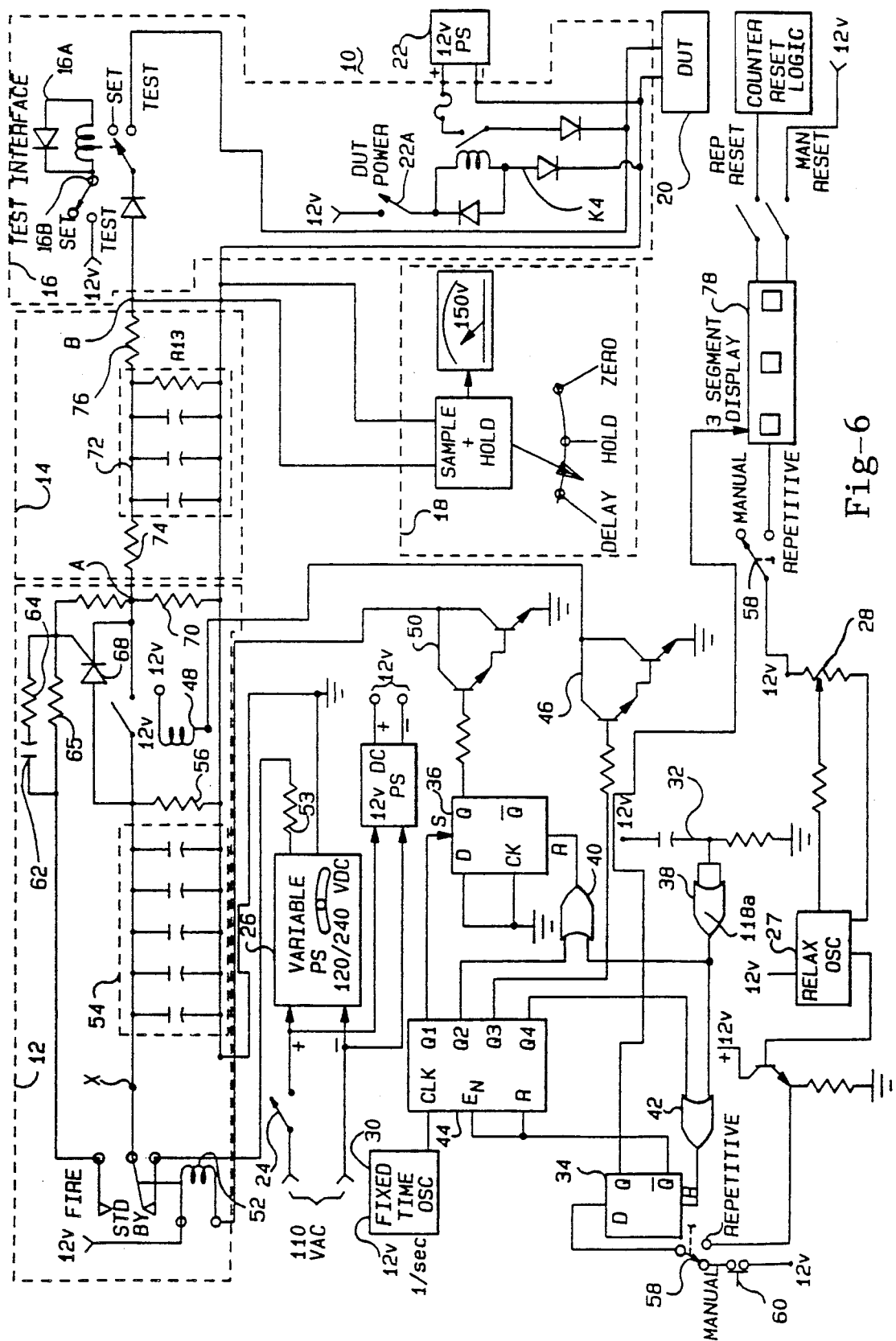
FIG. 6 illustrates a load dump simulator system of the present invention.

FIG. 6 shows the load dump simulator system 10 of this invention for testing a DUT 20. System 10 includes a first capacitance network 12, a second capacitance network 14 and a test interface 16. The DUT 20, a power source 22 of the DUT, and monitoring and instrumentation 18 connects to system 10 via interface 16. In a preferred embodiment, a sample and hold voltmeter serves as the instrument 18; a suitable sample and hold oscilloscope could serve as well.

The first capacitance network 12 has a dual function. This network initially connects up to a DC power source, charges up to the potential difference of the power source and, on command, isolates from the power source, joins the second capacitance network and shapes and forms the simulated transient pulse from the charge initially stored. The second capacitor network 14 functions to delay the rise time of the transient pulse while decreasing the effective internal impedance of the simulator making it possible to deliver over 100 amperes of current and over 125 joules of energy to a device under test with a load impedance of approximately one-half ohm.

FIG. 6 depicts a preferred embodiment of a load dump simulator. This simulator uses a charge dump technique involving two capacitance networks to delay the onset of the transient pulse and to reduce the internal impedance seen by the load. In order to simulate the worst case alternator load dump transient pulse, this simulator produces a pulse amplitude of about 105 volts with a delayed rise time of about 7 ms and presents an internal impedance to the load of around 0.5 ohm capable of delivering peak currents of about 210 amperes.

Previous attempts to scale existing simulators to the above parameters proved unsuccessful because no available means permitted delaying the rise times and reasonably increasing the voltage amplitude to acceptable levels. Storage capacitor values needed for scaling the existing simulators proved to be too large for implementing a practical simulator.

POWER AND SWITCHING OPERATIONS

From an input 110 vac source, after closing a POWER-ON switch 24, a variable DC power supply 26 turns ON to provide an output voltage which may vary between 130 to 240 volts DC for charge generation purposes and a 12 VDC power supply turns on to provide 12 volts of power for relay and logic circuits of system 10.

In response to the 12 volt DC power turning ON, three circuits immediately operate. Firstly, a variable rate relaxation oscillator 27 in this embodiment formed from a 555 timer and adjusted for a chosen rate by a potentiometer 28 operates to repetitively generate pulses when an operator selects a repetitive mode of operation. Oscillator 27 generates a pulse about once every 100–195 seconds. Secondly, a fixed timed oscillator 30 also formed from a 555 timer generates a pulse at a rate of about 1 pulse per second for one-shot operations. Thirdly, a R-C reset circuit 32 generates a reset pulse of about 1 second duration to reset first and second asynchronous sequential logic devices 34 and 36 respectively. The one-second pulse runs to a combinational logic network gate 38 directly, and then branches through gates 42 and 40 to respective reset ports of the first and second sequential logic devices 34 and 36. The sequential logic devices 34 and 36 are D-flip flops.

On reset, logic device 34 outputs a logic signal to reset a decade counter 44. The reset decade counter 44 outputs a low logical signal which holds off a first relay driver 46. The held-off driver 46 disables normally open relay 48. Relay 48 controls disabling a firing sequence of network 12. Also on reset, logic device 36 outputs a logic signal to a second relay driver 50 which holds off driver 50. The held-off driver 50 disables a normally closed relay 52. Relay 52, when disabled, places the system in a standby mode.

CHARGE GENERATION

Charge generation starts immediately after reset of counter 44 and the sequential logic devices 34 and 36. Illustratively, 180 volts DC routes from variable power supply 26 through normally closed contacts of relay 52 via a power supply current limiting resistor 53 to a parallel capacitance bank 54 of electrolytic capacitors of network 12, e.g., five Cornell Dublier FAH-4500-250-16, 4500 μF at 250 volt capacitors capable of establishing a charge of about 5.4 coulombs and storing 486 joules of energy.

SEGMENT A OF FIG. 7B

Figure 7:
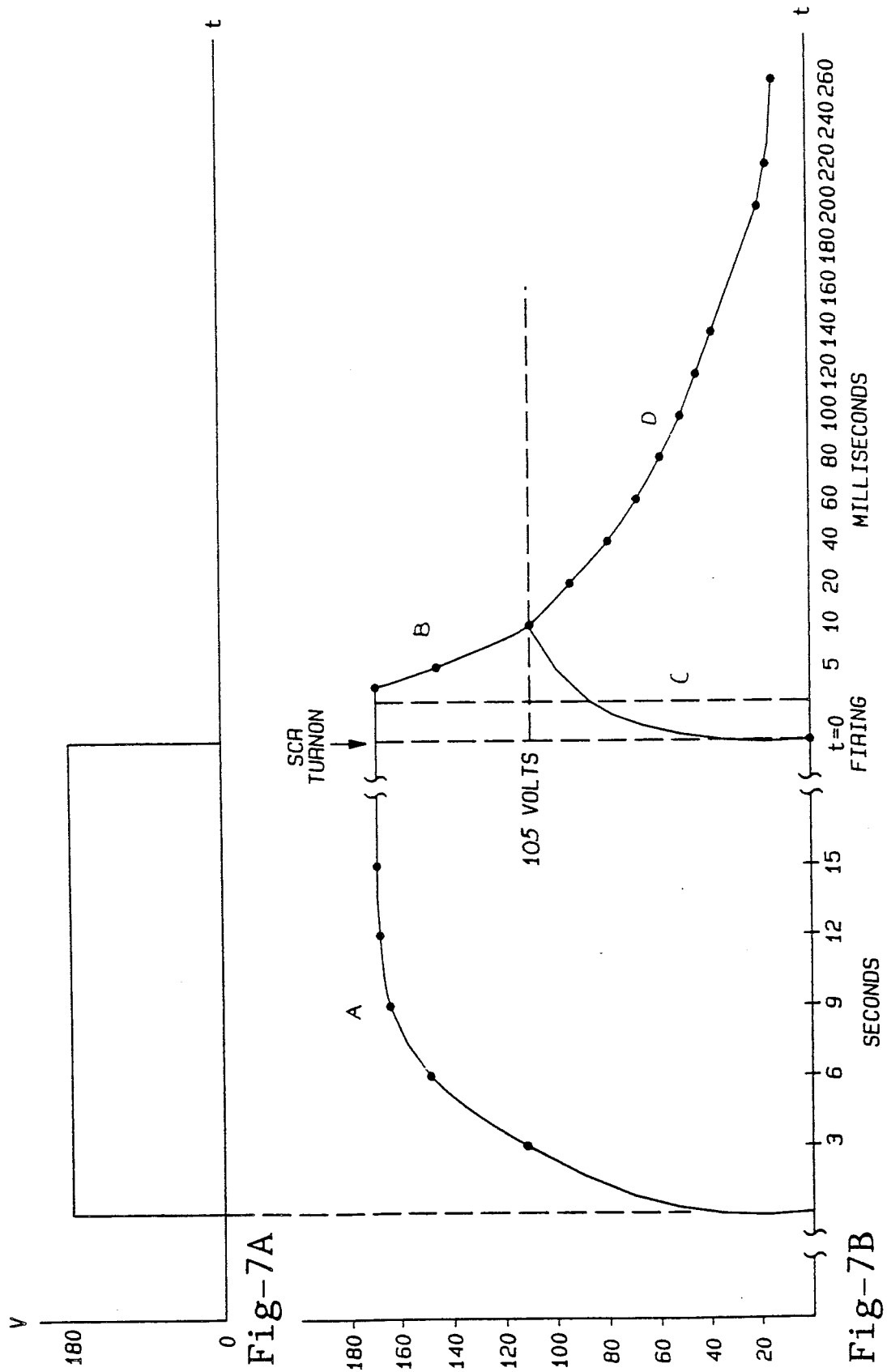
FIGS. 7A–7B depict waveforms associated with manual operation of the load dump simulator of FIG. 6.

FIG. 7A depicts the 180 volts step function from power supply 26, and segment A of FIG. 7B depicts the capacitance bank 54 charging up from 0 to 180 volts DC and remaining charged until removal of the 180 volts.

INSTANTANEOUS CAPACITOR BANK VOLTAGE

Equation 1 depicts the instantaneous voltage of capacitance bank 54 after closing power-on pushbutton 24.

$$e_C(54) = E_{STDBY}(1 - \epsilon^{-t/rc}) \tag{1}$$

where $E_{STDBY}$ = the voltage from power supply 26;
R = resistor 53 and C = capacitance bank 54.

Illustratively, if R = 100 Ω and C = 0.03 F, the RC time constant equals 3 seconds. Hence, after one time constant, the following equation (2) depicts the instantaneous voltage of bank 54:

$$e_C 54 = 180 \times (1 - \epsilon^{-3/3})$$

$$e_C 54 = 180 \times (1 - 0.367879)$$

$$e_C 54 = 180 \times (0.632121)$$

$$e_C 54 = 113.78 v \tag{2}$$

ISOLATING AND DUMPING OF THE STORAGE CHARGE

After storing the charge on capacitance bank 54, with a MANUAL/REPETITIVE SELECT SWITCH 58 in the MANUAL position, pressing momentary pushbutton 60 initiates isolating the first network 12 from variable DC power supply 26, connecting network 12 to network 14 and dumping the stored charge from bank 54 into the combined networks 12 and 14 to form the simulated transient pulse at an output terminal of network 14. When pressed, fire pushbutton 60 routes 12 volts DC through switch 58 (in the MANUAL position) to a set input of flip-flop 34 causing a HIGH signal to route from a not Q output to an enabling input of decade counter 44. Upon enabling counter 44 on the next clock pulse from timer 30, a first stage of counter 44 outputs a logical high signal which routes to a set input of flip-flop 36, setting the flip-flop. When set, a Q output of flip-flop 36 outputs a logic HIGH logical signal which turns ON relay driver 50. The turned ON driver 50, enables relay 52 causing a movable terminal of relay 52 to move from a stand-by mode position, opening the circuit between power supply 26 and network 12 to a FIRE mode position closing a normally open relay contact in a SCR gate trigger circuit within the first capacitance network 12.

With the FIRE position contact closed, current from bank 54 routes through the closed contact to the SCR gate trigger circuit comprised of a series/parallel capacitance/resistance network consisting of capacitor 62 and resistors 64 and 65. Capacitor 64 and resistor 65 provide a momentary HIGH current gate pulse to a gate of a SCR 68 to assure a fast, complete turn-on of the SCR to minimize dissipation of the stored charge.

WAVE SHAPING BY THE COMBINED CAPACITANCE NETWORKS

Having relay 52 energized to activate the FIRE mode, having network 12 isolated from power supply 26, with network 12 connected to network 14 via SCR 68, the combined networks 12 and 14 operate together to shape the simulated transient pulse derived from the energy stored in capacitor bank 54.

SEGMENT B OF FIG. 7B

As capacitance bank 54 discharges, current passes through SCR 68 and terminal A to provide an exponential charging voltage to a second capacitance bank 72 and an open circuit output voltage at terminal B.

Segment B of FIG. 7B depicts the discharge of capacitance bank 54. Equation 3 presents the instantaneous voltages for the discharging capacitance bank.

$$e_c = E_c(\epsilon^{-t/rc}) \tag{3}$$

Where $E_C$ = the initial potential difference across bank 54, R = resistor 74 + ESR of C54 + ESR of C72 and C = capacitance of resistor bank 54. One time constant (RC) of segment B = about 18 ms when resistor 74 = 0.3 Ω. ESR represents the equivalent series resistance of the capacitance.

SEGMENT C OF FIG. 7B

As capacitance bank 54 discharges, the second capacitance bank 72 charges as depicted in segment C of FIG. 7B.

SEGMENT D OF FIG. 7B

When the equivalent potential difference of capacitance bank 54 occurs across capacitance bank 72, both capacitance banks will discharge establishing the instantaneous potential differences at terminal B. Segment D of FIG. 7B illustrates this exponential decaying voltage with the dampened negative excursion fall time of about 300 ms across terminal B.

OUTPUT CURRENT

As depicted in FIG. 7B, the equilibrium voltage occurs about 10 ms after isolating capacitance bank 54 from power supply 24. At this time, bank 54 has a charge of about 3.15 coulombs and an energy content of 165.4 joules. Likewise, capacitance bank 72 has a charge of about 1.68 coulombs and an energy content of 88 joules. About 50 joules of energy dissipate through bleeder resistor 56.

Hence, with a load such as DUT 20, connected across terminal B, both capacitance banks 54 and 72 will discharge current to the load in disproportionate amounts.

COMPLETING MANUAL PULSE GENERATION

Within about two seconds from pressing the manual pushbutton 60 and the completion of the simulated transient pulse, another clock pulse from timer 30 clocks decade counter 44 to the next stage (Q2) causing a logical HIGH signal to pass through gate 40 to a reset terminal of flip-flop 36. When flip-flop 36 resets, the relay driver circuit 50 turns OFF disabling relay 52 and returning the system to the STANDBY mode.

Within another one second, another pulse from timer 30 clocks decade counter 44 to the next stage (Q3) causing a logical HIGH to route to relay driver circuit 46. Circuit 46 turns ON and enables relay 48 which closes a normally open relay contact circuit disposed between an anode and cathode of SCR 68 to reduce the current through the SCR below its minimum holding current threshold causing it to cease conduction.

Within still another second, another pulse from timer 30 clocks decade counter 44 to the next stage (Q4) causing a logical HIGH to route through gate 42 to a reset terminal of flip-flop 34. When flip-flop 34 resets, a logical HIGH signal routes to a reset terminal of decade counter 44 resetting this counter, terminating the manual pulse generation session.

DUT CONNECTION

Before connecting DUT 20 to terminal "B" of the second capacitance network 14, the closing of switch 80 causes power from the DUT power source 22 to route across the input power terminals of DUT 20.

A negative input power terminal of DUT 20 connects to a LOW side of terminal B of network 14 while a positive input power terminal routes to a normally open TEST terminal of a SET/TEST select relay 16A of the test interface 16. By pressing a SET/TEST switch 16B, relay 16A energizes causing the normally open TEST terminal to connect to the HIGH (+) side of terminal B of network 14 permitting the transient pulse from terminal B to route to the input of DUT 20. Having switch 16B in the SET position isolates the +side of DUT 20 from the +side of terminal B. Hence, an operator can then monitor the transient pulse at terminal "B" under no load conditions.

REPETITIVE MODE CIRCUITS

Placing select switch 58 in the REPETITIVE position connects the output of relaxation oscillator 27 to flip-flop 34. Doing this enables decade counter 44 to cycle through the four stages described supra every 100 to 195 seconds depending upon the rate setting of potentiometer 28 which regulates the timing of oscillator 27.

Since the Q output of flip-flop 34 routes to a 7 segment display counter 78, counter 78 counts each time flip-flop 34 sets.

Figure 8:
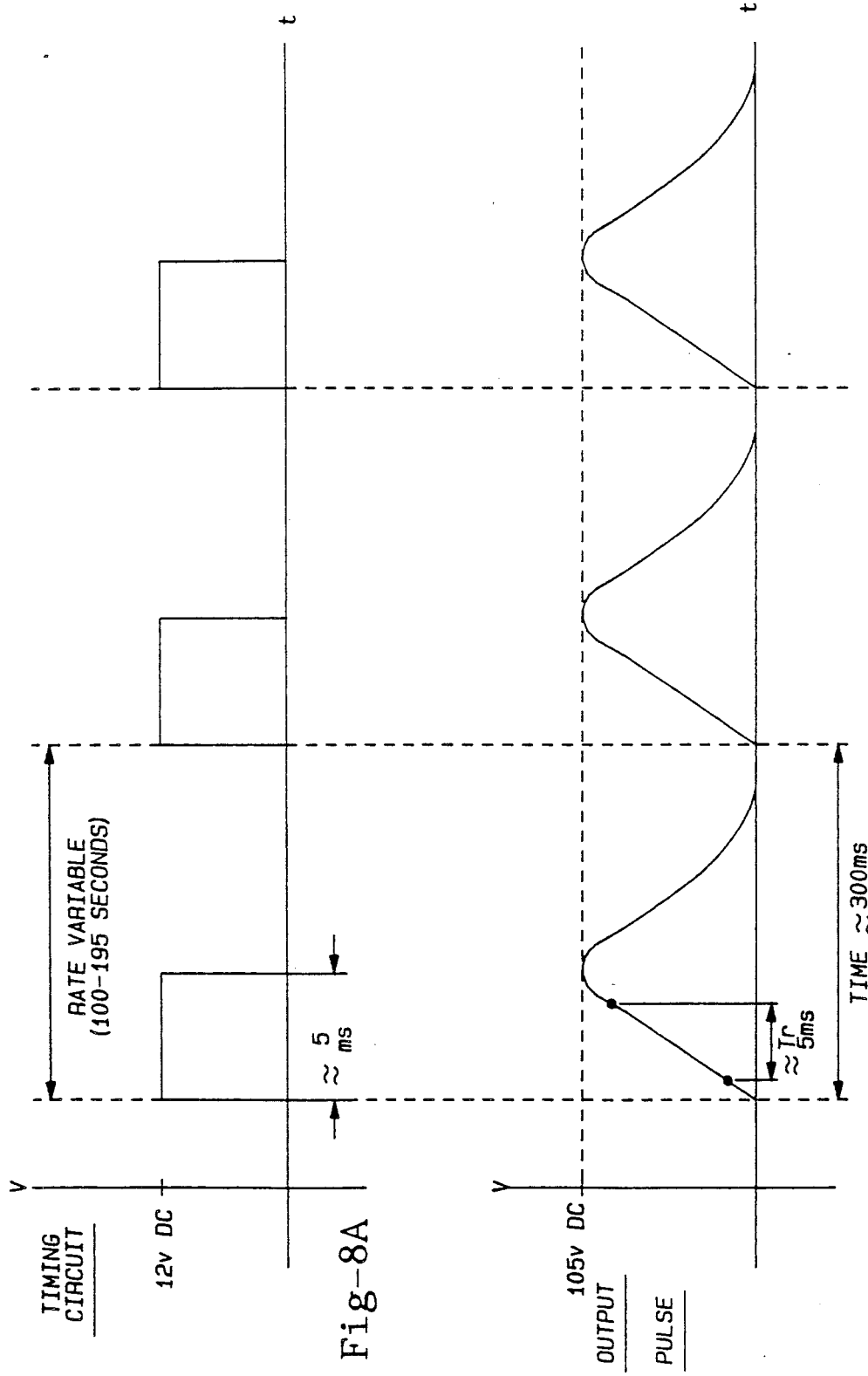
FIG. 8A and 8B illustrate waveforms associated with repetitive operation of the load dump simulator of FIG. 6.

Waveforms of FIGS. 8A and 8B depict the relaxation oscillator output and the voltage pulses at terminal "B", respectively.

OPERATION OF THE SYSTEM

Figure 9:
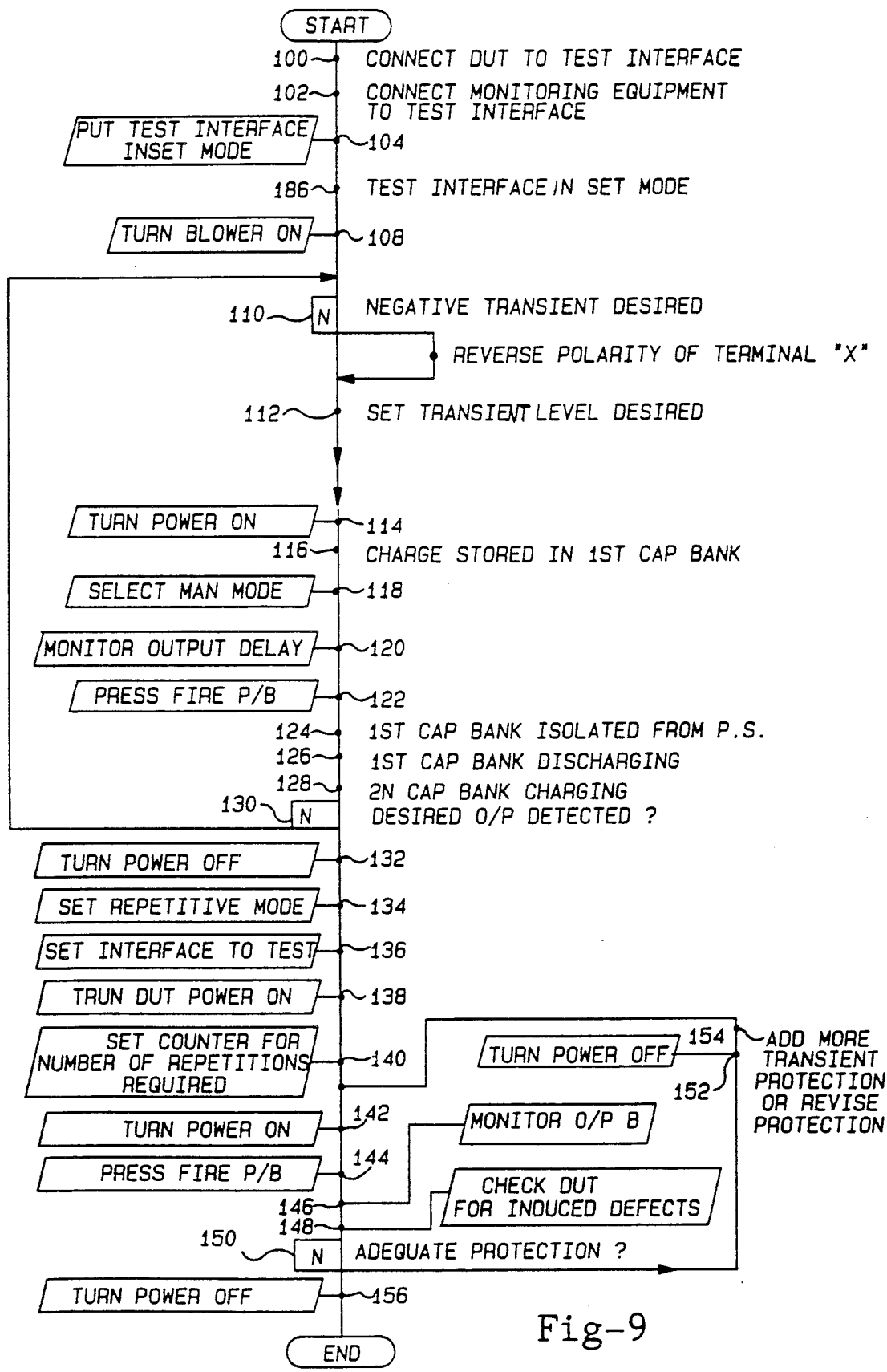
FIG. 9 illustrates a flowchart of the operation of the simulator system of this invention.

The flowchart of FIG. 9 provides a description of the operation of the load dump simulator system 10. Before describing the flowchart, some comments are in order.

This flowchart differs from the conventional box and diamond flowchart. In this diagram, the flow of control passes along the lines and proceed down the page. Conventional start-up of the program and end-of-program elongated circle symbols are used. Actions are signified by a small circle or dot on the lines with the description of the action being given to the left or right of the flow lines. Actions only take place on vertical lines. When introducing a decision, the flow line branches to the right or the left. The branch may be caused by either a YES or NO condition signified by a Y or N in a box as indicated. Where secondary flow rejoins the main flow, an arrowhead is used. The conventional trapezoid is used to indicate input or output operations. A reference number will indicate the point along the line being discussed.

With reference to FIG. 9, to start testing DUT 20 of FIG. 6 to determine whether the worst case transient would affect DUT 20, connect DUT 20 to the test interface 16 (step 100). Also connect the monitoring equipment 18 to the test interface 16 (step 102).

After making the above connections, place the SET/TEST select switch 16A of the test interface in the SET position (step 104) and turn on the blowers (step 108).

At step 110, the operator determines whether to develop a negative transient. If so, the operator reverses polarity of the capacitance banks at terminal "X". If not, the operator sets the desired amplitude of the transient by adjusting the output voltage of the variable power supply 26 (step 112). Then, to establish a charge on capacitance bank 54, the operator closes the POWER ON switch 24 so the 120 vac routes to the simulator (step 114) causing pulsating dc voltage to apply to capacitance bank 54 charging the capacitors up to the potential difference of the supplied dc voltage (step 116.) After charging capacitance bank 54, the operator places the MANUAL/REPETITIVE SELECT switch 58 to the manual mode (step 118).

After setting the monitoring equipment 18 to monitor an output delay of the transient pulse (step 120), the operator presses the FIRE pushbutton 60 (step 122). At this time, the simulator automatically isolates capacitance banks 54 from the pulsating DC power (step 124). Capacitance bank 54 discharges causing its stored charge to dump into the uncharged capacitance bank 72, charging bank 72 up until an equivalent potential difference occurs across each bank (steps 126 and 128). Then both capacitance banks concurrently discharge current to the output and a single simulated load dump transient pulse generates. The operator checks the monitoring equipment to determine if the desired transient pulse did occur (step 130). If it didn't, the operator branches back to step 110 and repeats the setup for the type of transient desired. If the desired transient occurred, the operator then turns off the power switch 24 (step 132), sets switch 66B to TEST (step 136), turns the DUT power switch 22A ON (step 138), sets the counter 78 for a preset number of required repetitions (step 140), turn on power switch 24 (step 142) and then press the FIRE pushbutton 60 (step 144).

The transient pulse travels through the test interface to the DUT. At the test interface, the pulse is monitored at output terminal "B" and recorded (step 146).

Then the operator checks for thermal defects in the DUT (step 148). The 7-segment display counter 28 counts the number of repetitions of the transients and monitoring equipment if desired records and monitors the repetitions. The operator checks the DUT for any thermal defects (step 148) and then makes a determination as to the suitability of the transient suppression devices (step 150).

If the device does not contain adequate transient protection, then the operator should turn off power switch 24 (step 152) and add or revise the transient suppression devices as needed (step 154). Afterwards, the operator should return to step 142 and repeat generating the repetition pulses.

If the device contains adequate transient suppression devices, the operator turns off power switch 24 (switch 156) and then ends the test.

We claim:

1. A variable load dump simulator test system for determining endurance of electronic devices to a variety of transient pulses that the devices could encounter, illustratively, in a vehicle, said system comprising:
   a) a variable power source means having an input terminal coupled to an alternating current power source and producing therefrom at an output terminal a voltage signal of a chosen amplitude;
   b) a first switch means having a first input switch terminal coupled to receive the voltage signal of said variable power source means and a switchable terminal for transferring the received voltage signal at the input switch terminal to an output/input port in a first position and for isolating the voltage signal at the input terminal from the output/input port in a second position, said second position including a first output switch terminal for transferring out voltage signals received at the output/input port when said first switch means is in the second position, said first switch means also having actuating means responsive to activating signals for switching said switchable terminal from the first to the second position and vice versa;
   c) control means for switching said first switch means from said first position to said second position on command of an operator;
   d) a first capacitance bank means of a first chosen capacity, initially in an uncharged state, having an input terminal coupled to said output/input port of said first switch means for receiving the voltage signal while said first switch means is in said first position and for becoming charged to the potential difference of the voltage signal and thereafter providing at said output/input port the potential difference equal to the voltage signal;
   e) a second capacitance bank means of a second chosen capacity, initially in an uncharged state, having an input terminal arranged to receive the potential difference of the first capacitance bank means from said first output switch terminal for charging up during a chosen period of time to a potential difference equal to that of said first capacitance bank means while the first capacitance bank means is in a discharging condition and producing thereafter an output discharging current to an output terminal having a device-under-test (DUT) connected thereto; and
   f) a solid state controlled switch means having an input terminal connected to the output terminal of said first capacitance bank means, an output connected to the input terminal of said second capacitance bank means, and an actuating terminal connected to the first output switch terminal of said first switch means and after said first switch means is in the second position, producing at said first output switch terminal a discharging current from said first capacitance bank means which routes to said second capacitance bank means, said second capacitance bank means firstly charging up to a potential difference substantially equal to a discharged voltage of said first capacitance bank means and thereafter discharging with said first capacitance bank means into input terminals of said DUT so as to provide a simulated transient pulse used to test the endurance of said DUT to such a pulse.

2. Apparatus in accordance with claim 1 wherein said control means includes means for repetitively charging and then isolating said first capacitance bank means and then discharging the isolated capacitance bank means into said second capacitance bank means to charge said second capacitance bank means to a voltage equal to that of said first capacitance bank means as said first capacitance bank means discharges whereafter both capacitance banks means simultaneously discharge into said DUT.

3. Apparatus in accordance with claim 2 wherein said system includes a test interface connected between said second capacitance bank means and said DUT for interconnecting a sample and hold voltmeter monitoring equipment for monitoring the amplitude of the simulated transient pulses and for supplying independent power to said DUT.

4. Apparatus in accordance with claim 3 wherein said system includes means for determining the effects of the simulated transient pulse on the DUT at various amplitudes of the input voltage signal and at various segments of the transient pulse.

* * * * *